(12) United States Patent
Mitarashi

(10) Patent No.: US 6,909,307 B2
(45) Date of Patent: Jun. 21, 2005

(54) BIDIRECTIONAL BUS DRIVER AND BIDIRECTIONAL BUS CIRCUIT

(75) Inventor: Mutsumi Mitarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 12 days.

(21) Appl. No.: 10/732,359

(22) Filed: Dec. 11, 2003

(65) Prior Publication Data

US 2004/0257110 A1 Dec. 23, 2004

(30) Foreign Application Priority Data

Jun. 18, 2003 (JP) ........................................ 2003-172809

(51) Int. Cl.[7] .............................................. H03K 19/00
(52) U.S. Cl. .............................. 326/56; 326/86; 326/90; 710/110
(58) Field of Search ................................ 326/56–58, 83, 326/90, 86; 710/100, 126

(56) References Cited

U.S. PATENT DOCUMENTS

| | | | |
|---|---|---|---|
| 5,202,593 A | | 4/1993 | Huang et al. |
| 5,736,870 A | * | 4/1998 | Greason et al. ................ 326/86 |
| 5,801,549 A | * | 9/1998 | Cao et al. ...................... 326/83 |
| 6,515,515 B1 | * | 2/2003 | Bozso et al. ................... 326/86 |
| 6,834,318 B2 | * | 12/2004 | Hunter et al. ................ 710/110 |

FOREIGN PATENT DOCUMENTS

JP  2001-102914  4/2001

* cited by examiner

*Primary Examiner*—Vibol Tan
(74) *Attorney, Agent, or Firm*—Rabin & Berdo, P.C.

(57) ABSTRACT

A bidirectional bus driver includes a first buffer which supplies the data signal to the second bus when the first control signal is enabled; a second buffer which supplies the data signal to the first bus when the first control signal is enabled; a first control; a second control; a third buffer which supplies a signal in the second bus to the first bus when the second control signal is enabled; and a fourth buffer which supplies a signal in the first bus to the second bus when the third control signal is enabled. The first control circuit enables the second control signal when a signal transition is detected in the second bus while the first control signal is not enabled; and the second control circuit enables the third control signal when a signal transition is detected in the first bus while the first control signal is not enabled.

11 Claims, 9 Drawing Sheets

BIDIRECTIONAL BUS DRIVER AND BIDIRECTIONAL BUS CIRCUIT

BACKGROUND OF THE INVENTION

1. Field of the Invention

The present invention relates to a bidirectional bus driver which drives an internal bidirectional bus of a semiconductor integrated circuit and a bidirectional bus circuit including bidirectional buses and the bidirectional bus driver.

2. Description of the Related Art

A conventional bidirectional signal control circuit is disclosed, for example, in Japanese Patent Publication Kokai (Laid-Open) No. 2001-102914. FIG. 7 is a schematic circuit diagram showing the structure of the conventional bidirectional signal control circuit. In the circuit shown in FIG. 7, a bidirectional bus N140 is driven by multiple tristate buffer circuits 112, 122, and 132, each disposed in separate circuit blocks 110, 120, and 130. These circuit blocks 110, 120, and 130 receive a data signal from the bidirectional bus N140, through receiver circuits 111, 121, and 131 disposed in the respective circuit blocks.

A conventional bidirectional bus repeater is disclosed, for example, in U.S. Pat. No. 5,202,593. FIG. 8 is a schematic circuit diagram showing the structure of the conventional bidirectional bus repeater. FIG. 9 is a timing chart illustrating the operation of the bidirectional bus repeater shown in FIG. 8. If external bus drivers (not shown) connected to buses 212 and 214 in the circuit shown in FIG. 8 do not pull the buses to a low logic level, the supply voltage across resistors included in buffers 216 and 218 causes the buses 212 and 214 to be pulled up, consequently bringing signals A and B to a high logic level ($t_{11}$ in FIG. 9). Meanwhile, control signals BD and AD output from three-input NOR gates 224 and 226 are low, and control signals AU and BU output from single-shot devices 220 and 222 are low ($t_{11}$ in FIG. 9).

When an external bus driver (not shown) connected to the bus 214 pulls the bus to a low logic level, bringing the signal A to a low logic level, the control signal BD output from the three-input NOR gate 224 is brought to a high logic level, and the buffer 218 brings the signal B in the bus 212 to a low logic level ($t_{12}$ in FIG. 9). Even after this high-to-low transition in the signal B in the bus 212, the control signal AD remains low because the control signal BD supplied to the three-input NOR gate 226 is high ($t_{12}$ in FIG. 9).

When an external bus driver (not shown) connected to the bus 214 pulls the bus to a high logic level or does not pull the bus to a low logic level, the control signal BD output from the three-input NOR gate 224 is brought to a low logic level ($t_{21}$ in FIG. 9). The falling edge of the control signal BD triggers a single-shot device 222 to generate a high level pulse as the control signal BU, and the buffer 218 immediately brings the signal B in the bus 212 to a high logic level ($t_{21}$ in FIG. 9).

The conventional bidirectional signal control circuit shown in FIG. 7 has the following problem. As the semiconductor integrated circuits of succeeding generations have finer design rules, the pitches of wiring for connecting logic gates have become narrow and are becoming smaller than the wiring height. In fine wiring, the coupling capacitance between adjacent wires is larger than the coupling capacitance between adjacent wiring layers. As the cross-sectional area of wiring shrinks, the wiring resistance per unit length increases. Consequently, a long wire such as the bus N140 shown in FIG. 7 develops a delay due to wiring capacitance and wiring resistance, obstructing high-speed signal transfer.

The conventional bidirectional bus repeater shown in FIG. 8 has another problem. When a low-to-high transition occurs in the signal A of the bus 214 (waveform a1 in FIG. 9), the three-input NOR gate 224 brings the control signal BD to a low logic level (waveform a2 in FIG. 9). The falling edge of the control signal BD triggers a single-shot device 222 to generate a high level pulse as the control signal BU high (waveform a3 in FIG. 9). As the waveform a3 in FIG. 9 indicates, the rise of the control signal BU by a single-shot device 222 may occur a little later than the fall of the control signal BD by the three-input NOR gate 224. If this delay occurs, the three inputs B, BD, and BU of the three-input NOR gate 226 are kept low for a period between the fall of the control signal BD ($t_{31}$ in FIG. 9) and the rise of the control signal BU ($t_{32}$ in FIG. 9) (the period between $t_{31}$ and $t_{32}$ is magnified in FIG. 9), bringing the control signal AD output from the three-input NOR gate 226 to a high logic level (a4 in FIG. 9) for a brief moment. Meanwhile, the buffer 216 pulls down the signal A of the bus 214 (a5 in FIG. 9) for a brief moment. When an external bus driver (not shown) connected to the bus 214 does not pull the bus to a low logic level and when the pull-up resistor of the buffer 216 pulls up the bus 214, an oscillation occurs, and the circuit operation becomes unstable. If an external bus driver (not shown) connected to the bus 214 pulls the bus to a high logic level, a large current momentarily flows from the external bus driver (not shown) to the buffer 216. This will impair the reliability of the wiring.

SUMMARY OF THE INVENTION

It is an object of the present invention to provide a bidirectional bus driver which makes it possible to implement high-speed signal transfer by means of a bidirectional bus and to provide a bidirectional bus circuit including the bidirectional bus driver.

It is another object of the present invention to provide a bidirectional bus driver which can improve the stability of the circuit operation and the reliability of the circuit and to provide a bidirectional bus circuit including the bidirectional bus driver.

According to the present invention, a bidirectional bus driver receives a first control signal and a data signal, and has a function of transferring a signal between a first bus and a second bus and a function of driving the first bus and the second bus. The bidirectional bus driver includes a first buffer which supplies the data signal to the second bus when the first control signal is enabled; a second buffer which supplies the data signal to the first bus when the first control signal is enabled; a first control circuit which generates a second control signal; a second control circuit which generates a third control signal; a third buffer which supplies a signal in the second bus to the first bus when the second control signal is enabled; and a fourth buffer which supplies a signal in the first bus to the second bus when the third control signal is enabled. The first control circuit enables the second control signal for a certain period of time when a signal transition is detected in the second bus while the first control signal is not enabled; and the second control circuit enables the third control signal for a certain period of time when a signal transition is detected in the first bus while the first control signal is not enabled.

The present invention makes it possible to divide a long bidirectional bus to shorter blocks, so that wiring delay resulting from increase in wiring capacitance or wiring resistance of the bidirectional bus can be reduced, and consequently high-speed signal transfer can be implemented.

The present invention also prevents the circuit operation from becoming unstable when a transition occurs in a signal from the bidirectional bus, and consequently prevents a DC current from flowing during data transfer between bidirectional buses, so that the operation stability and the reliability of the bidirectional bus driver and the bidirectional bus circuit can be improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
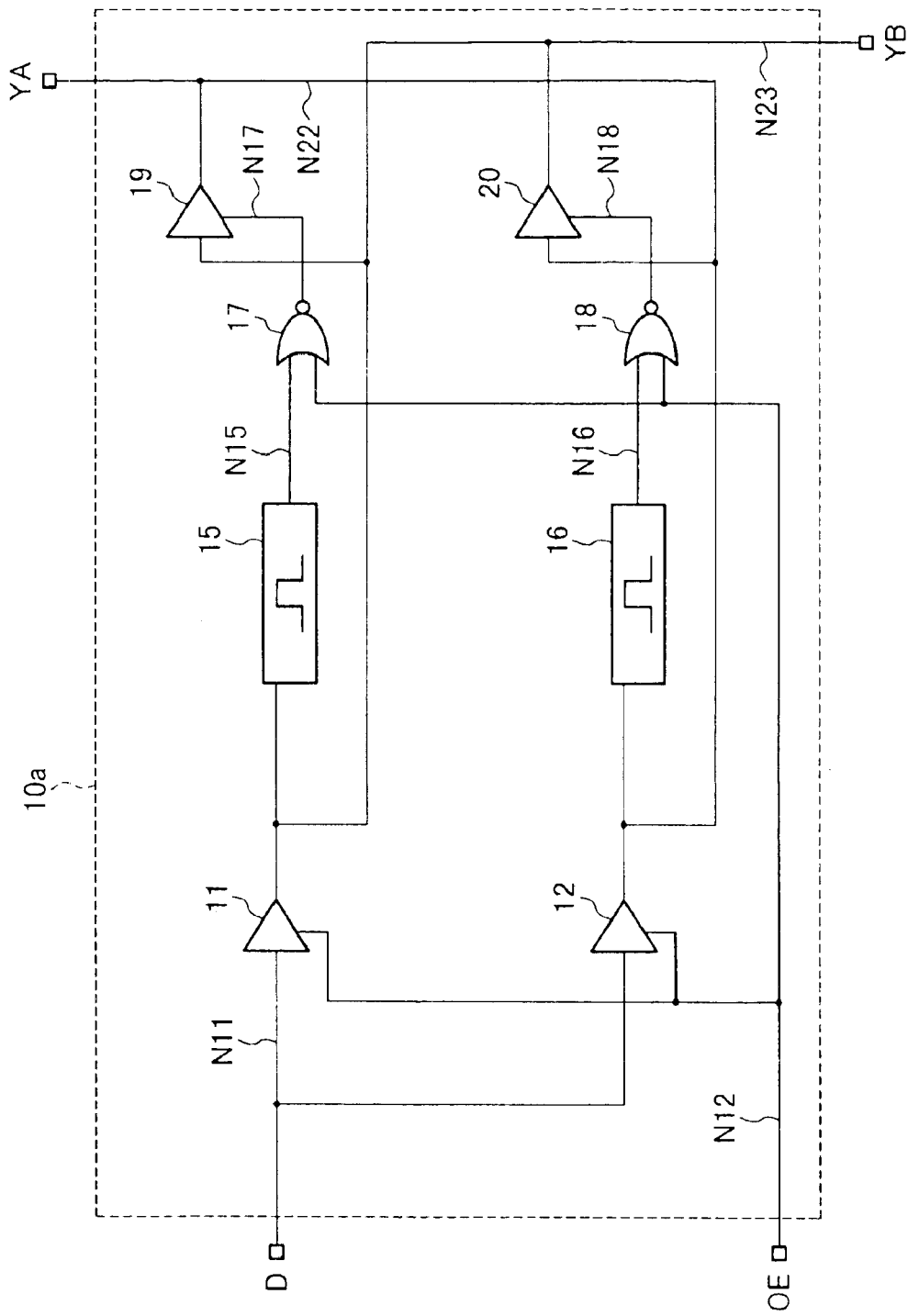
FIG. 1 is a schematic circuit diagram showing the structure of a bidirectional bus driver in accordance with a first embodiment of the present invention.

FIG. 1 is a schematic circuit diagram showing the structure of a bidirectional bus driver 10a in accordance with a first embodiment of the present invention.

As shown in FIG. 1, the bidirectional bus driver 10a of the first embodiment includes tristate buffer circuits 11 and 12 for driving buses YB and YA, and tristate buffer circuits 19 and 20 for transferring a signal between the buses YA and YB. The bidirectional bus driver 10a of the first embodiment also includes transition detectors 15 and 16 and two-input NOR gates 17 and 18, provided to generate a control signal which controls the tristate buffer circuits 19 and 20. The transition detector 15 and the two-input NOR gate 17 form a control circuit which generates a control signal for controlling the operation of the tristate buffer circuit 19. The transition detector 16 and the two-input NOR gate 18 form another control circuit which generates a control signal for controlling the operation of the tristate buffer circuit 20.

The tristate buffer circuit 11 receives a data signal D and a control signal OE and has an output end connected to the bus YB (node N23). The tristate buffer circuit 12 receives the data signal D and the control signal OE and has an output end connected to the bus YA (node N22).

The transition detector 15 has an input end connected to the bus YB. When a low-to-high transition or a high-to-low transition occurs in the bus YB, the transition detector 15 generates a single-shot pulse having a low logic level and outputs this signal to a node N15. The transition detector 16 has an input end connected to the bus YA. When a low-to-high transition or a high-to-low transition occurs in the bus YA, the transition detector 16 generates a single-shot pulse having a low logic level and outputs this signal to a node N16. The two-input NOR gate 17 receives the signal from the node N15 and the control signal OE, and has an output end connected to a node N17, which is connected to a control terminal (enable terminal) of the tristate buffer circuit 19. The two-input NOR gate 18 receives a signal from the node N16 and the control signal OE, and has an output end connected to a node N18, which is connected to the control terminal (enable terminal) of the tristate buffer circuit 20. The tristate buffer circuit 19 receives a signal from the bus YB as data input, and has an output end connected to the bus YA. The tristate buffer circuit 20 receives the signal in the bus YA as data input, and has an output end connected to the bus YB.

The operation of the bidirectional bus driver 10a to drive the buses YA and YB will now be described. When the data signal D is supplied to the buses YA and YB, the control signal OE is brought to a high logic level (that is, the tristate buffer circuits 11 and 12 are enabled). If a low-to-high transition occurs in the data signal D while the control signal OE is high, the tristate buffer circuit 11 pulls the bus YB to a high logic level. Meanwhile, the transition detector 15 receives the signal in the bus YB and supplies a single-shot pulse having a low logic level to the node N15. However, because the control signal OE is high, the output of the two-input NOR gate 17 (node N17) is low. Consequently, the output of the tristate buffer circuit 19 remains in the high-impedance state. In the meantime, the tristate buffer circuit 12 brings the bus YA to a high logic level. The transition detector 16 receives the signal in the bus YA and supplies a single-shot pulse having a low logic level to the node N16. However, because the control signal OE is high, the output of the two-input NOR gate 18 (node N18) is low. Consequently, the output of the tristate buffer circuit 20 remains in the high-impedance state.

If a high-to-low transition occurs in the data signal D while the control signal OE is high, the tristate buffer circuit 11 brings the bus YB to a low logic level. Meanwhile, the transition detector 15 receives the signal in the bus YB and supplies a single-shot pulse having a low logic level to the node N15. However, because the control signal OE is high, the output of the two-input NOR gate 17 (node N17) is low. Consequently, the output of the tristate buffer circuit 19 remains in the high-impedance state. In the meantime, the tristate buffer circuit 12 brings the bus YA to a low logic level. The transition detector 16 receives the signal in the bus YA and supplies a single-shot pulse having a low logic level to the node N16. However, because the control signal OE is high, the output of the two-input NOR gate 18 (node N18) is low. Consequently, the output of the tristate buffer circuit 20 remains in the high-impedance state.

The operation of the bidirectional bus driver 10a to transfer a signal between the two buses YA and YB will next be described. When a signal is transferred between the buses YA and YB, the control signal OE is brought to a low logic level (the tristate buffer circuits 11 and 12 are not enabled). When the control signal OE goes low, the outputs of the tristate buffer circuits 11 and 12 enter the high-impedance state. If an external bus driver, not shown in the figure, functions while both the bus YA and the bus YB are high, and brings just the bus YA to a low logic level, the transition detector 16 supplies a single-shot pulse having a low logic level to the node N16. Because the control signal OE is low, the two-input NOR gate 18 supplies a single-shot pulse having a high logic level to the control terminal of the tristate buffer circuit 20. Meanwhile, the output of the tristate buffer circuit 20 goes low. When the bus YB goes low, the transition detector 15 supplies a single-shot pulse having a low logic level to the node N15. Because the control signal OE is low, the two-input NOR gate 17 supplies a single-shot pulse having a high logic level to the control terminal of the tristate buffer circuit 19. When the output of the tristate buffer circuit 19 goes low, the bus YA has already been low, and therefore no DC current passes through the bus YA. In this way, the low logic level of the bus YA is transferred to the bus YB.

If an external bus driver, not shown in the figure, pulls the bus YB to a high logic level, the transition detector 15 supplies a single-shot pulse having a low logic level to the node N15. Because the control signal OE is low, the two-input NOR gate 17 supplies a single-shot pulse having a high logic level to the control terminal of the tristate buffer circuit 19. Meanwhile, the output of the tristate buffer circuit 19 goes high. When the bus YA goes high, the transition detector 16 supplies a single-shot pulse having a low logic level to the node N16. Because the control signal OE is low, the two-input NOR gate 18 supplies a single-shot pulse having a high logic level to the control terminal of the tristate buffer circuit 20. When the output of the tristate buffer circuit 20 goes high, the bus YB has already been high, and therefore no DC current passes through the bus YB. In this way, the high logic level of the bus YB is transferred to the bus YA.

As has been described above, the bidirectional bus driver literally transfers a signal in both directions. If the control signal OE is high, the data signal D is output to the buses YA and YB. If the control signal OE is low, when a signal transition is detected in either the bus YA or the bus YB, the data signal is transferred to the opposite side (i.e., the other bus).

The bidirectional bus driver 10a of the first embodiment can divide the bidirectional bus having a large wiring length into shorter sections, as has been described above. Therefore, wiring delay due to increase in wiring capacitance or wiring resistance of the bidirectional bus can be reduced, and consequently high-speed signal transfer can be performed.

Figure 8:
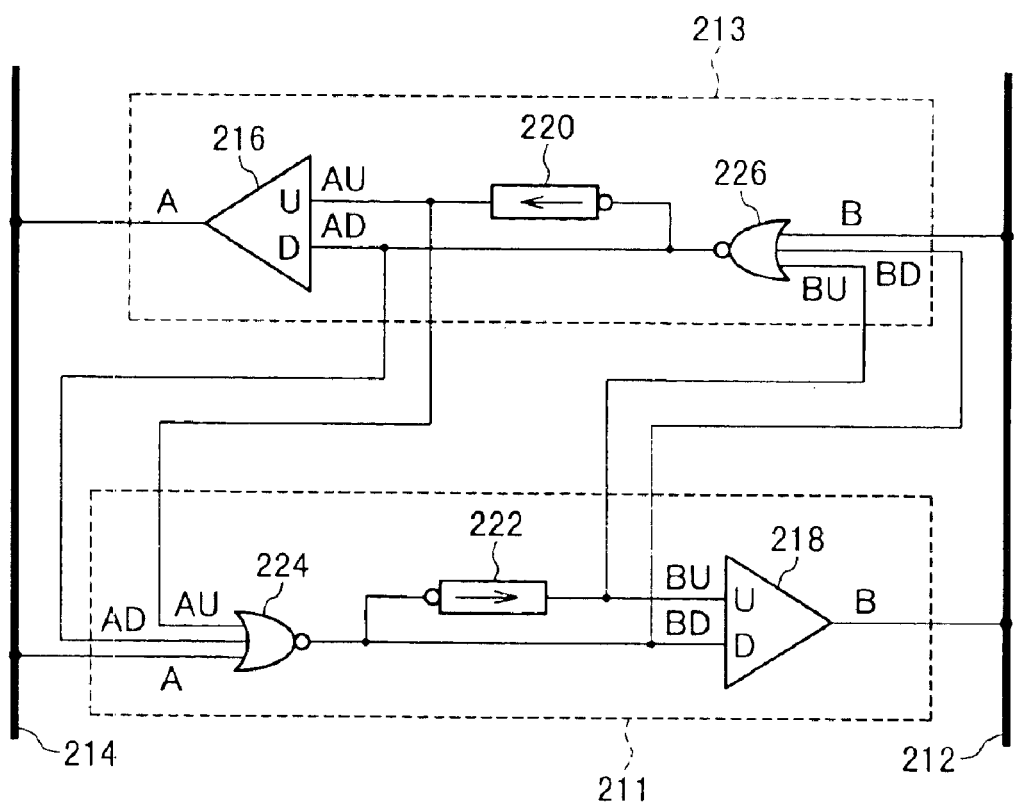
FIG. 8 is a schematic circuit diagram showing the structure of a conventional bidirectional bus repeater.
Figure 9:
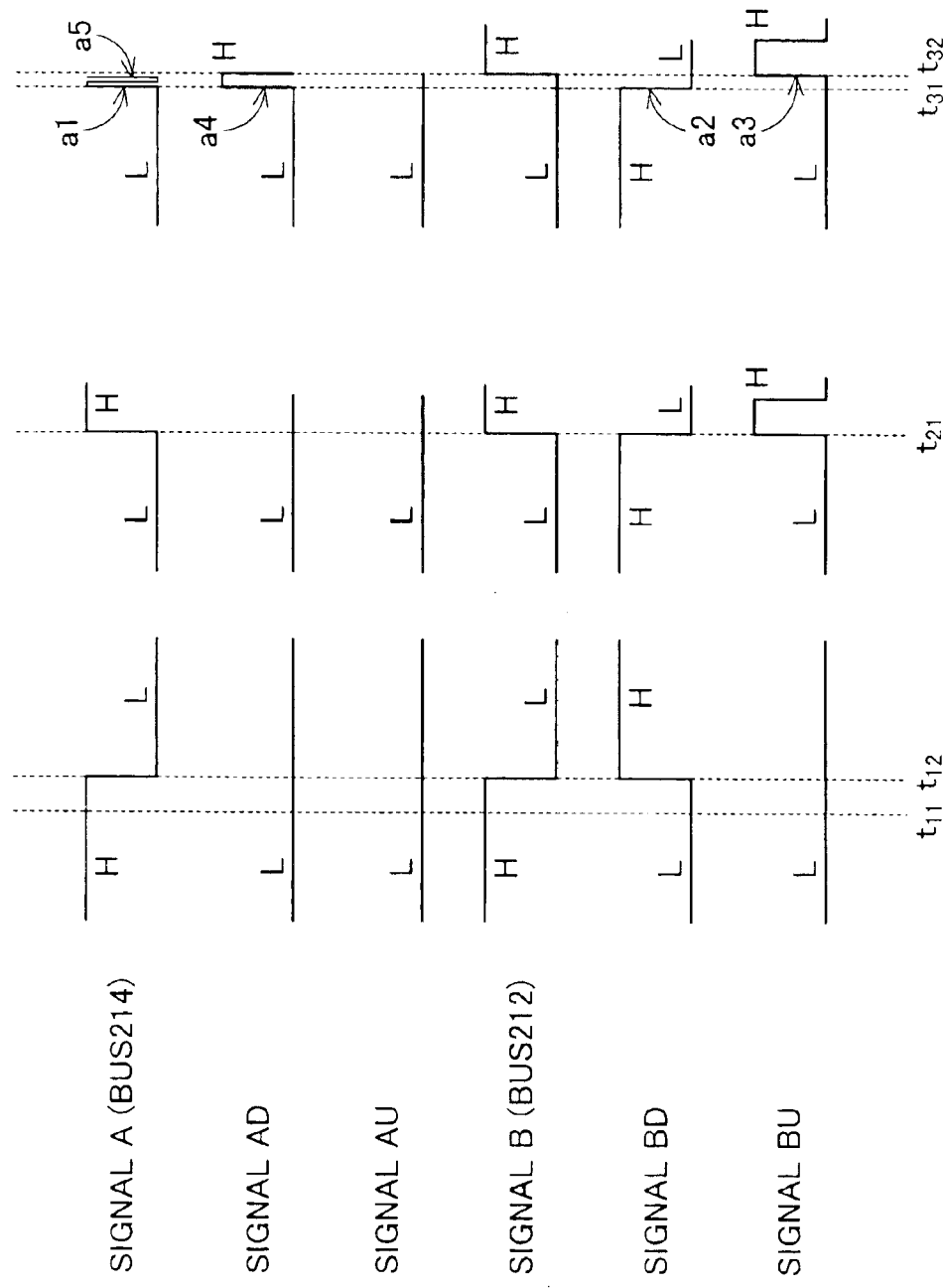
FIG. 9 is a timing chart illustrating the operation of the bidirectional bus repeater shown in FIG. 8.

The bidirectional bus driver 10a of the first embodiment prevents unstable circuit operation which would occur in the bidirectional bus repeater shown in FIG. 8. Because no DC current will flow during data transfer between the bidirectional buses, the operation stability and circuit reliability can be improved.

Second Embodiment

Figure 2:
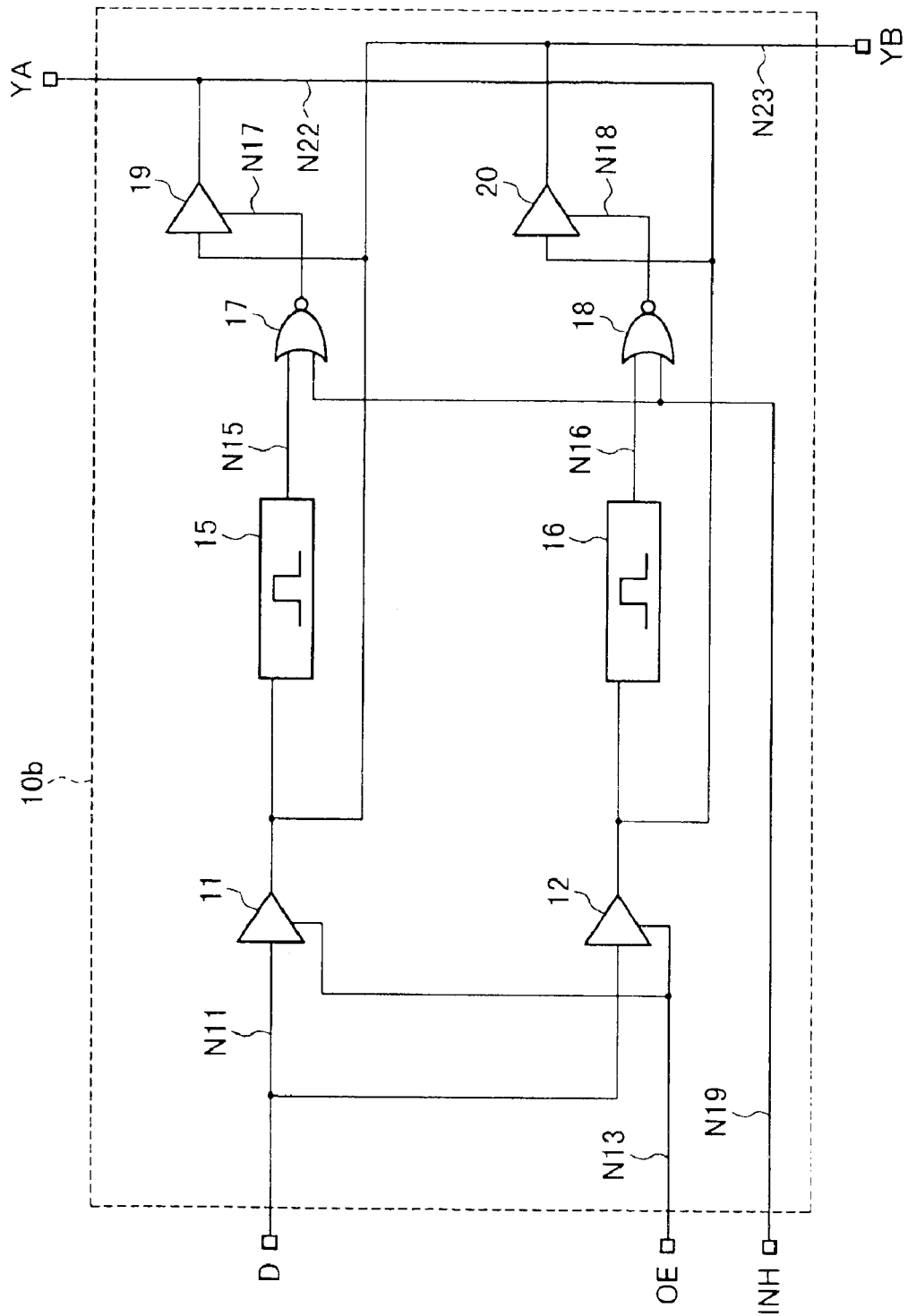
FIG. 2 is a schematic circuit diagram showing the structure of a bidirectional bus driver in accordance with a second embodiment of the present invention.

FIG. 2 is a schematic circuit diagram showing the structure of a bidirectional bus driver 10b in accordance with a second embodiment of the present invention. In FIG. 2, elements which are the same as or equivalent to elements in FIG. 1 will be indicated by like reference characters.

As shown in FIG. 2, the bidirectional bus driver 10b of the second embodiment differs from the bidirectional bus driver 10a of the first embodiment in the following two points. First, a control signal OE and a control signal INH are input to the bidirectional bus driver 10b. Second, the control signal INH is used to control the tristate buffer circuits 19 and 20. If the control signals OE and INH are in the same logic level, the bidirectional bus driver 10b of the second embodiment operates in the same way as the bidirectional bus driver 10a of the first embodiment. If the control signal OE is low while the control signal INH is high, the outputs of the tristate buffer circuits 11, 12, 19, and 20 are in the high-impedance state. In this case, the bidirectional bus driver 10b electrically isolates the bus YA from the bus YB. It is prohibited to input the control signal OE held high and the control signal INH held low at the same time.

Because the bus YA is electrically isolated from the bus YB while the control signal OE is low and the control signal INH is high, the bidirectional bus driver 10b of the second embodiment can concurrently carry out data transfer with a circuit block (not shown) including an external buffer connected to the bus YA and data transfer with a circuit block (not shown) including an external buffer connected to the bus YB. Therefore, with the bidirectional bus driver 10b of the second embodiment, the bidirectional buses can be used more efficiently.

Except for the above-described respects, the second embodiment is the same as the first embodiment.

Third Embodiment

Figure 3:
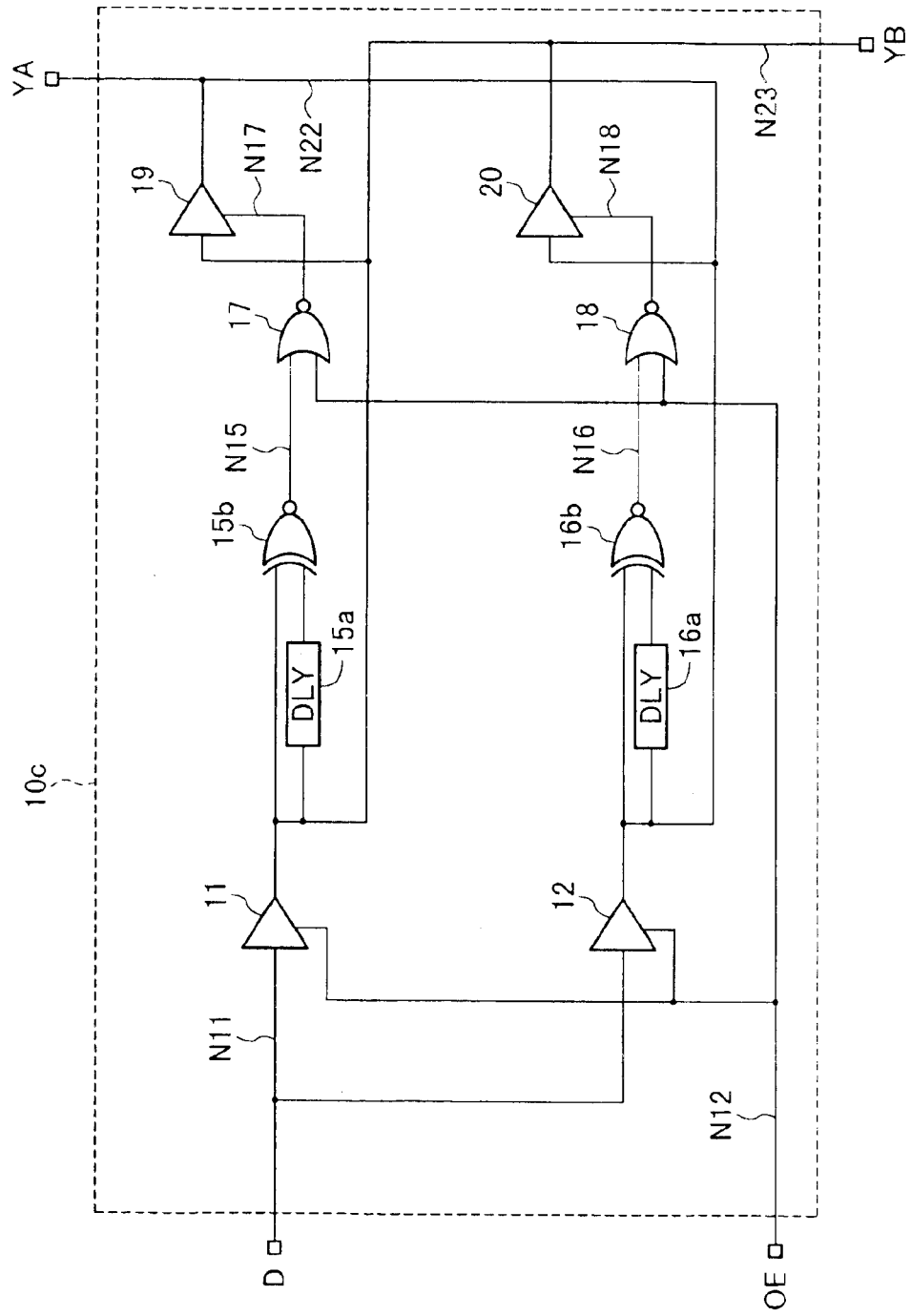
FIG. 3 is a schematic circuit diagram showing the structure of a bidirectional bus driver in accordance with a third embodiment of the present invention.

FIG. 3 is a schematic circuit diagram showing the structure of a bidirectional bus driver 10c in accordance with a third embodiment of the present invention. In FIG. 3, elements which are the same as or equivalent to elements in FIG. 1 will be indicated by like reference characters.

The bidirectional bus driver 10c of the third embodiment shown in FIG. 3 differs from the bidirectional bus driver 10a of the first embodiment described above in the following two points. First, a delay circuit 15a and a two-input EXNOR (exclusive NOR) gate 15b are provided instead of the transition detector 15 of the bidirectional bus driver 10a of the first embodiment. Second, a delay circuit 16a and a two-input EXNOR (exclusive NOR) gate 16b are provided instead of the transition detector 16 of the bidirectional bus driver 10a of the first embodiment. Third, the delay times of the delay circuits 15a and 16a are sufficiently greater than the delay times of the tristate buffer circuits 19 and 20 and are smaller than the predetermined cycle time of the bidirectional bus.

The circuit operation of the bidirectional bus driver 10c of the third embodiment is fundamentally the same as the circuit operation of the bidirectional bus driver 10a of the first embodiment. The operation of the delay circuit 15a and the two-input EXNOR gate 15b will next be described. If a transition occurs in the signal in the bus YB, the delay circuit 15a outputs the signal in the bus YB after a certain delay time. The two-input EXNOR gate 15b receives the output signal of the delay circuit 15a and the signal in the bus YB. When the two-input EXNOR gate 15b receives a signal from the bus YB, the output goes low. Then, when the output of the delay circuit 15a goes to the same logic level as the signal from the bus YB, the output of the two-input EXNOR gate 15b goes high. Therefore, a single-shot pulse having a low logic level is output. The delay time of the delay circuit 15a is sufficiently greater than the delay time of the tristate buffer circuit 19 and is smaller than the predetermined cycle time of the bidirectional bus, so that the control signal of the tristate buffer circuit 19 is enabled until the output of the tristate buffer circuit 19 is determined. The delay circuit 16a and the two-input EXNOR gate 16b operate in the same manner as the delay circuit 15a and the two-input EXNOR gate 15b.

In the bidirectional bus driver 10c of the third embodiment, the delay circuits 15a and 16a and the two-input EXNOR gates 15b and 16b form transition detectors, and the delay times of the delay circuits 15a and 16a are sufficiently greater than the delay time of the tristate buffer circuit and smaller than the predetermined cycle time of the bidirectional bus. Accordingly, in the bidirectional bus driver 10c of the third embodiment, the control signals of the tristate buffer circuits 19 and 20 are enabled until the outputs of the tristate buffer circuits 19 and 20 are determined. The control signals of the tristate buffer circuits 19 and 20 will not be enabled before the outputs of the tristate buffer circuits 19 and 20 are completely determined, so that the reliability of the circuit operation can be enhanced.

Figure 4:
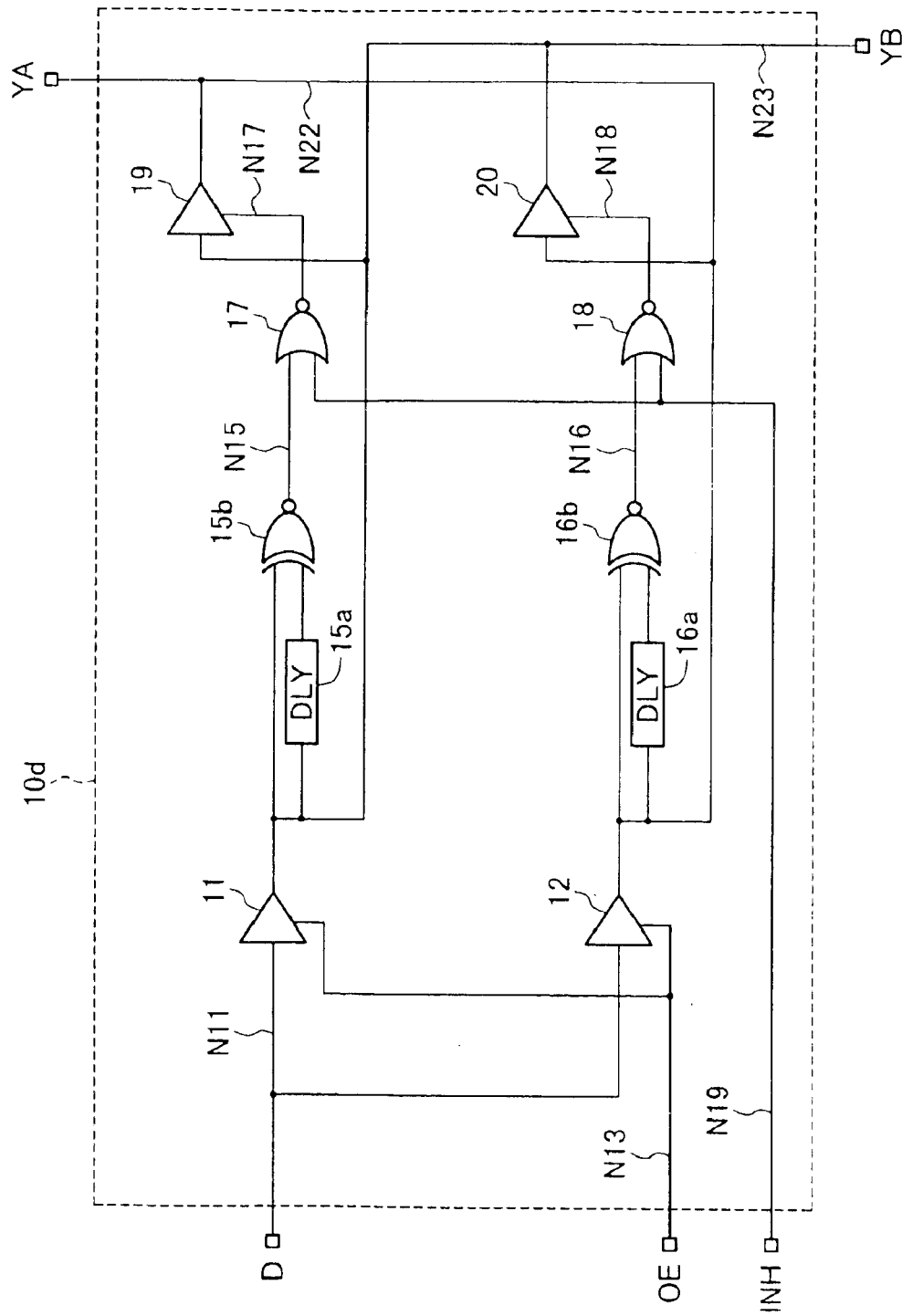
FIG. 4 is a schematic circuit diagram showing the structure of a bidirectional bus driver in accordance with a variation of the third embodiment of the present invention.

FIG. 4 is a schematic circuit diagram showing the structure of another bidirectional bus driver 10d (modified example) in accordance with the third embodiment of the present invention. In FIG. 4, elements which are the same as or equivalent to elements in FIG. 3 will be indicated by like reference characters.

As shown in FIG. 4, the bidirectional bus driver 10d differs from the bidirectional bus driver 10c shown in FIG. 3 in the following two points. First, two control signals OE and INH are input to the bidirectional bus driver 10d. Second, the control signal INH is used to control the tristate buffer circuits 19 and 20. If both the control signal OE and the control signal INH are in the same logic level, the bidirectional bus driver 10d shown in FIG. 4 operates in the same way as the bidirectional bus driver 10c shown in FIG. 3. If the control signal OE is low while the control signal INH is high, the outputs of the tristate buffer circuits 11, 12, 19, and 20 are in the high-impedance state. Meanwhile, the bidirectional bus driver 10d electrically isolates the bus YA from the bus YB. It is inhibited to input the control signal OE held high and the control signal INH held low at the same time. Accordingly, with the bidirectional bus driver 10d of the third embodiment, the bidirectional buses can be used more efficiently.

Except for the above-described respects, the third embodiment is the same as the first or second embodiment.

Fourth Embodiment

Figure 5:
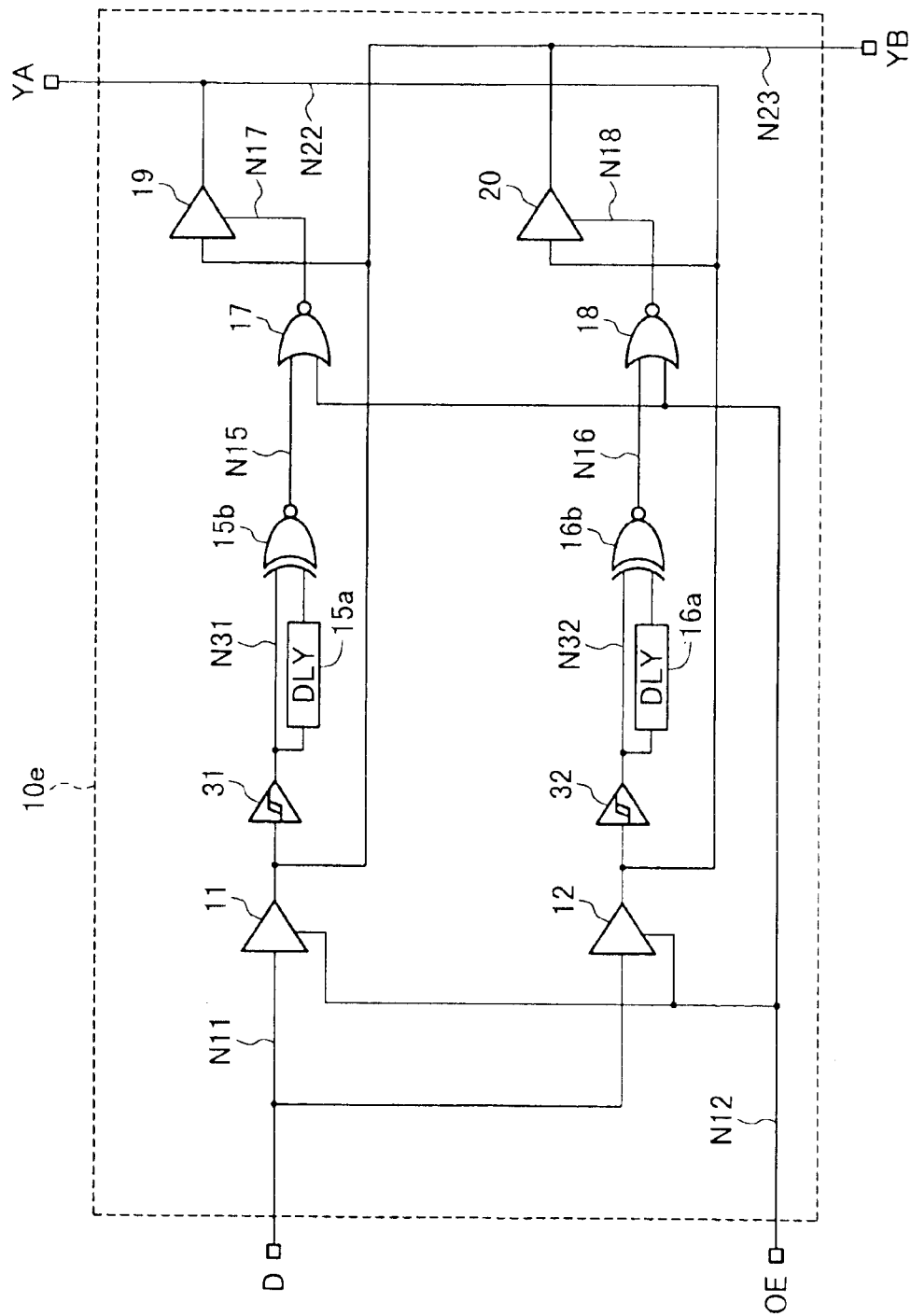
FIG. 5 is a schematic circuit diagram showing the structure of a bidirectional bus driver in accordance with a fourth embodiment of the present invention.

FIG. 5 is a schematic circuit diagram showing the structure of a bidirectional bus driver 10e in accordance with a fourth embodiment of the present invention. In FIG. 5, elements which are the same as or equivalent to elements in FIG. 3 will be indicated by like reference characters.

As shown in FIG. 5, the bidirectional bus driver 10e of the fourth embodiment differs from the bidirectional bus driver 10c of the third embodiment (FIG. 3) in the following points. First, a Schmitt circuit 31 is disposed between the bus YB and the input stage pertaining to both the delay circuit 15a and the two-input EXNOR gate 15b. Second, a Schmitt circuit 32 is disposed between the bus YA and the input stage pertaining to both the delay circuit 16a and the two-input EXNOR gate 16b. The bidirectional bus driver 10e of the fourth embodiment operates in the same manner as the bidirectional bus driver 10c of the third embodiment. The Schmitt circuits 31 and 32 have a transfer characteristic exhibiting hysteresis against changes in the signal from the bus YA or bus YB, and can shape the input waveforms into neat square waves. In the bidirectional bus driver 10e of the fourth embodiment, the Schmitt circuits 31 and 32 are disposed between the buses YA and YB and the input stages pertaining to the delay circuits 15a and 16a and two-input EXNOR gates 15b and 16b, to form circuits for generating a control signal of the tristate buffer circuits 19 and 20, so that the tristate buffer circuits 19 and 20 function as tristate buffer circuits having a transfer characteristic exhibiting hysteresis against changes in the signal from the bus YA or YB. Accordingly, the bidirectional bus driver 10e of the fourth embodiment can have enhanced resistance to noise which results from the coupling capacitance or the like and is superimposed on the bus YA or YB.

Except for the above-described respects, the fourth embodiment is the same as the third embodiment. The fourth embodiment (FIG. 5) is formed by adding the Schmitt circuits 31 and 32 to the structure of the third embodiment (FIG. 3). The Schmitt circuits 31 and 32 may also be added to the structure shown in FIG. 1, FIG. 2, or FIG. 4, in the same manner as shown in FIG. 5.

Fifth Embodiment

Figure 6:
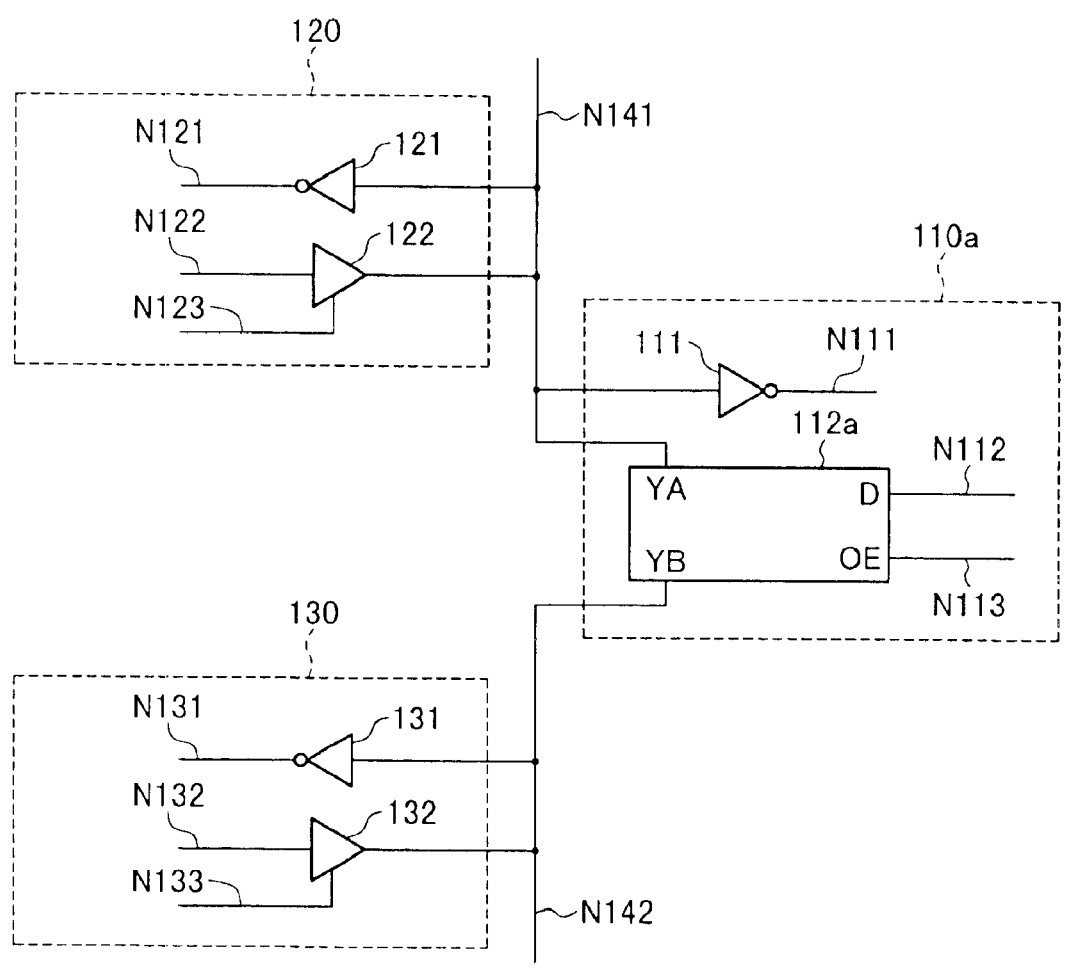
FIG. 6 is a schematic circuit diagram showing the structure of a bidirectional bus circuit of a fifth embodiment of the present invention.
Figure 7:
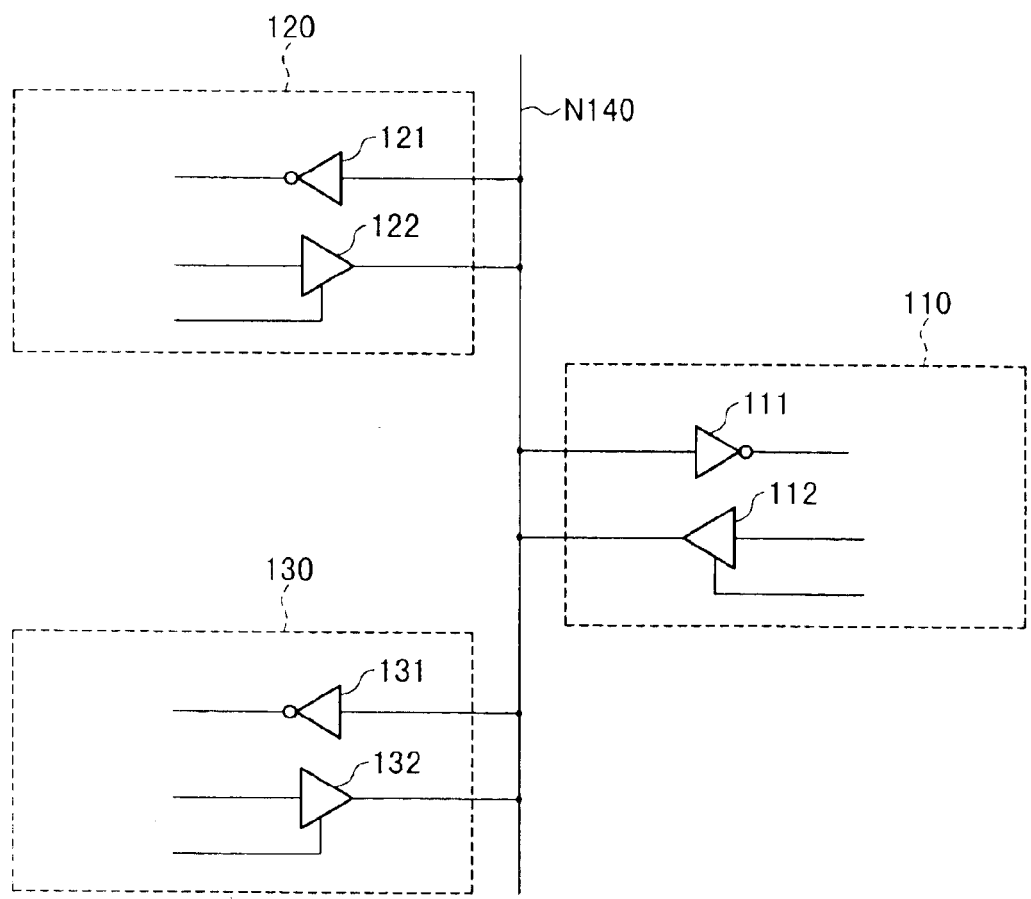
FIG. 7 is a schematic circuit diagram showing the structure of a conventional bidirectional signal control circuit.

FIG. 6 is a schematic circuit diagram showing the structure of a bidirectional bus circuit in accordance with a fifth embodiment of the present invention.

The bidirectional bus circuit shown in FIG. 6 includes buses N141 and N142, a circuit block 120 including a tristate buffer circuit 122 and a receiver circuit 121, a circuit block 130 including a tristate buffer circuit 132 and a receiver circuit 131, and a circuit block 110a including a bidirectional bus driver 112a and a receiver circuit 111.

As shown in FIG. 6, the output end of the tristate buffer circuit 122 in the circuit block 120, the input end of the receiver circuit 121 in the circuit block 120, the input end of the receiver circuit 111 in the circuit block 110a, and the YA terminal of the bidirectional bus driver 112a in the circuit block 110a are connected to the bus N141. The output end of the tristate buffer circuit 132 in the circuit block 130, the input end of the receiver circuit 131 in the circuit block 130, and the YB terminal of the bidirectional bus driver 112a in the circuit block 110a are connected to the bus N142. The bidirectional bus driver 112a is the same as the bidirectional bus driver 10a of the first embodiment (FIG. 1), bidirectional bus driver 10c of the third embodiment (FIG. 3), or the bidirectional bus driver 10e of the fourth embodiment (FIG. 5).

In a semiconductor chip, the circuit block 120 is disposed in an upper part, the circuit block 130 is disposed in a lower part, and the circuit block 110a is disposed in the middle. Accordingly, the distance between the circuit blocks 120 and 130 is greater than the distance between the circuit blocks 120 and 110a or the distance between the circuit blocks 130 and 110a.

When data is transferred from the circuit block 120 to the circuit block 130, data is placed in the node N122 of the circuit block 120, and the control signal of the buffer 122 (node N123) is brought to a high logic level. Both the node N113 in the circuit block 110a and the node N133 in the circuit block 130 are brought to a low logic level. Meanwhile, the data signal is output through the tristate buffer circuit 122 to the bus N141, then transferred through the bidirectional bus driver 112a in the circuit block 110a to the bus N142. The data signal transferred to the bus N142 is inverted by the receiver circuit 131 and appears in the node N131. Data transfer from the circuit block 130 to the circuit block 120 is carried out in a similar manner.

When data is transferred from the circuit block 110a to the circuit block 120 or 130, the data to be transferred is placed in the node N112, and the node N113 is brought to a high logic level. It is supposed that the node N123 and the node N133 are low at that time. When the node N113 is brought to a high logic level, the data signal is output from the node N112 to the bus N141 and N142. The inverse of the data signal in the node N112 is obtained in the node N121 in the circuit block 120 and in the node N131 in the circuit block 130.

The bidirectional bus circuit of the fifth embodiment includes a plurality of circuit blocks which share a bidirectional bus. The bidirectional bus driver 112a is disposed in the circuit block 110a provided in the middle between both ends of the bidirectional bus, to divide the bidirectional bus. The wiring length of the bidirectional bus is reduced, and capacitance parasitic to the output of the tristate buffer circuit and a gate load connected to the bidirectional bus is reduced. Accordingly, the bidirectional bus circuit of the fifth embodiment makes it possible to provide a semiconductor integrated circuit which can carry out high-speed data transfer with reduced wiring resistance and load capacitance viewed from the tristate buffer circuit for driving the bidirectional bus.

Further, because the rise time and fall time of the signal waveform of the bidirectional bus can be reduced, a current flowing through the receiver circuit (CMOS inverter, for instance) provided in each circuit block can be reduced. Accordingly, a semiconductor integrated circuit with reduced power consumption can be provided.

The bidirectional bus driver 112a may be replaced by the bidirectional bus driver 10b of the second embodiment (FIG. 2) or the bidirectional bus driver 10d of the variation of the third embodiment (FIG. 4).

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A bidirectional bus driver which receives a first control signal and a data signal, and has a function of transferring a signal between a first bus and a second bus and a function of driving said first bus and said second bus; said bidirectional bus driver comprising:
   a first buffer which supplies said data signal to said second bus when said first control signal is enabled;
   a second buffer which supplies said data signal to said first bus when said first control signal is enabled;
   a first control circuit which generates a second control signal;
   a second control circuit which generates a third control signal;
   a third buffer which supplies a signal in said second bus to said first bus when said second control signal is enabled; and
   a fourth buffer which supplies a signal in said first bus to said second bus when said third control signal is enabled;
   said first control circuit enabling said second control signal for a certain period of time when a signal transition is detected in said second bus while said first control signal is not enabled; and
   said second control circuit enabling said third control signal for a certain period of time when a signal transition is detected in said first bus while said first control signal is not enabled.

2. The bidirectional bus driver according to claim 1, wherein said first control circuit includes:
   a first transition detector which detects a signal transition in said second bus, thereby generating a first pulse; and
   a first logic circuit which enables said second control signal for a certain period of time determined by said first pulse when said first control signal is not enabled; and
   said second control circuit includes:
   a second transition detector which detects a signal transition in said first bus, thereby generating a second pulse; and
   a second logic circuit which enables said third control signal for a certain period of time determined by said second pulse when said first control signal is not enabled.

3. The bidirectional bus driver according to claim 2, wherein said first transition detector includes:
   a first delay circuit which delays said signal in said second bus, thereby generating a first delay signal; and
   a third logic circuit which outputs an exclusive NOR of said signal in said second bus and said first delay signal output from said first delay circuit; and
   said second transition detector includes:
   a second delay circuit which delays said signal in said first bus, thereby generating a second delay signal; and
   a fourth logic circuit which outputs an exclusive NOR of said signal in said first bus and said second delay signal output from said second delay circuit.

4. The bidirectional bus driver according to claim 2, wherein said first transition detector includes:
   a first Schmitt circuit which receives said signal in said second bus;
   a first delay circuit which delays said output signal of said first Schmitt circuit, thereby generating a first delay signal; and
   a third logic circuit which outputs an exclusive NOR of said output signal of said first Schmitt circuit and said first delay signal output from said first delay circuit; and
   said second transition detector includes:
   a second Schmitt circuit which receives said signal in said first bus;
   a second delay circuit which delays said output signal of said second Schmitt circuit, thereby generating a second delay signal; and
   a fourth logic circuit which outputs an exclusive NOR of said output signal of said second Schmitt circuit and said second delay signal output from said second delay circuit.

5. A bidirectional bus driver which receives a first control signal, a second control signal, and a data signal, and has a function of transferring a signal between a first bus and a second bus and a function of driving said first bus and said second bus; said bidirectional bus driver comprising:
   a first buffer which supplies said data signal to said second bus when said first control signal is enabled;
   a second buffer which supplies said data signal to said first bus when said first control signal is enabled;
   a first control circuit which generates a third control signal;
   a second control circuit which generates a fourth control signal;

a third buffer which supplies said signal in said second bus to said first bus when said third control signal is enabled; and a fourth buffer which supplies said signal in said first bus to said second bus when said fourth control signal is enabled;

said first control circuit enabling said third control signal for a certain period of time if a signal transition is detected in said second bus while said second control signal is not enabled; and said second control circuit enabling said fourth control signal for a certain period of time if a signal transition is detected in said first bus while said second control signal is not enabled.

6. The bidirectional bus driver according to claim 5, wherein said first control circuit includes:

a first transition detector which generates a first pulse when a signal transition is detected in said second bus; and a first logic circuit which enables said third control signal for a certain period of time determined by said first pulse if said second control signal is not enabled; and said second control circuit includes:

a second transition detector which generates a second pulse when a signal transition is detected in said first bus; and a second logic circuit which enables said fourth control signal for a certain period of time determined by said second pulse if said second control signal is not enabled.

7. The bidirectional bus driver according to claim 6, wherein said first transition detector includes:

a first delay circuit which delays said signal in said second bus, thereby generating a first delay signal; and a third logic circuit which outputs an exclusive NOR of said signal in said second bus and said first delay signal output from said first delay circuit; and said second transition detector includes:

a second delay circuit which delays said signal in said first bus, thereby generating a second delay signal; and a fourth logic circuit which outputs an exclusive NOR of said signal in said first bus and said second delay signal output from said second delay circuit.

8. The bidirectional bus driver according to claim 6, wherein said first transition detector includes:

a first Schmitt circuit which receives said signal in said second bus;

a first delay circuit which delays said output signal of said first Schmitt circuit, thereby generating a first delay signal; and a third logic circuit which outputs an exclusive NOR of said output signal of said first Schmitt circuit and said first delay signal output from said first delay circuit; and said second transition detector includes:

a second Schmitt circuit which receives said signal in said first bus;

a second delay circuit which delays said output signal of said second Schmitt circuit, thereby generating a second delay signal; and a fourth logic circuit which outputs an exclusive NOR of said output signal of said second Schmitt circuit and said second delay signal output from said second delay circuit.

9. The bidirectional bus driver according to claim 5, wherein said first control signal and said second control signal are controlled to inhibit such a state that said first control signal enables said first buffer and said second buffer while said second control signal does not enable said third buffer and said fourth buffer.

10. A bidirectional bus circuit comprising:

a first bus;

a second bus;

a first circuit block connected to said first bus;

a second circuit block connected to said second bus; and a third circuit block connected to said first bus and said second bus;

said bidirectional bus circuit transferring data in opposite directions between said first circuit block and said second circuit block, through said first bus, said third circuit block, and said second bus; and said third circuit block including a bidirectional bus driver which receives a first control signal and a data signal, and has a function of transferring a signal between said first bus and said second bus and a function of driving said first bus and said second bus;

wherein said bidirectional bus driver comprises:

a first buffer which supplies said data signal to said second bus when said first control signal is enabled;

a second buffer which supplies said data signal to said first bus when said first control signal is enabled;

a first control circuit which generates a second control signal;

a second control circuit which generates a third control signal;

a third buffer which supplies a signal in said second bus to said first bus when said second control signal is enabled; and a fourth buffer which supplies a signal in said first bus to said second bus when said third control signal is enabled;

said first control circuit enabling said second control signal for a certain period of time when a signal transition is detected in said second bus while said first control signal is not enabled; and said second control circuit enabling said third control signal for a certain period of time when a signal transition is detected in said first bus while said first control signal is not enabled.

11. A bidirectional bus circuit comprising:

a first bus;

a second bus;

a first circuit block connected to said first bus;

a second circuit block connected to said second bus; and a third circuit block connected to said first bus and said second bus;

said bidirectional bus circuit transferring data in opposite directions between said first circuit block and said second circuit block, through said first bus, said third circuit block, and said second bus; and said third circuit block including a bidirectional bus driver which receives a first control signal, a second control signal, and a data signal, and has a function of transferring a signal between said first bus and said second bus and a function of driving said first bus and said second bus;

wherein said bidirectional bus driver comprises:

a first buffer which supplies said data signal to said second bus when said first control signal is enabled;

a second buffer which supplies said data signal to said first bus when said first control signal is enabled;

a first control circuit which generates a third control signal;

a second control circuit which generates a fourth control signal;

a third buffer which supplies said signal in said second bus to said first bus when said third control signal is enabled; and a fourth buffer which supplies said signal in said first bus to said second bus when said fourth control signal is enabled;

said first control circuit enabling said third control signal for a certain period of time if a signal transition is detected in said second bus while said second control signal is not enabled; and said second control circuit enabling said fourth control signal for a certain period of time if a signal transition is detected in said first bus while said second control signal is not enabled.

* * * * *